(12) United States Patent
Kim et al.

(10) Patent No.: US 8,877,551 B2
(45) Date of Patent: Nov. 4, 2014

(54) METHOD OF MANUFACTURING A THIN-FILM TRANSISTOR, METHOD OF MANUFACTURING A DISPLAY SUBSTRATE, AND DISPLAY SUBSTRATE

(75) Inventors: Bo-Sung Kim, Seoul (KR); Jun-Ho Song, Seongnam-si (KR); Doo-Na Kim, Seongnam-si (KR); Kang-Moon Jo, Seoul (KR); Tae-Young Choi, Seoul (KR); Masataka Kano, Hwaseong-si (KR); Yeon-Taek Jeong, Seoul (KR)

(73) Assignee: Samsung Display Co., Ltd. (KR)

( * ) Notice: Subject to any disclaimer, the term of this patent is extended or adjusted under 35 U.S.C. 154(b) by 15 days.

(21) Appl. No.: 13/619,075

(22) Filed: Sep. 14, 2012

(65) Prior Publication Data

US 2013/0234169 A1 Sep. 12, 2013

(30) Foreign Application Priority Data

Mar. 8, 2012 (KR) .................. 10-2012-0023850

(51) Int. Cl.
*H01L 21/00* (2006.01)

(52) U.S. Cl.
USPC .......................................... 438/104

(58) Field of Classification Search
USPC ............................................ 438/104, 85, 158
See application file for complete search history.

(56) References Cited

U.S. PATENT DOCUMENTS

| | | | |
|---|---|---|---|
| 7,306,979 B2 * | 12/2007 | Chang et al. | 438/149 |
| 7,754,523 B2 * | 7/2010 | Seo et al. | 438/99 |
| 8,062,936 B2 * | 11/2011 | Seo et al. | 438/149 |
| 2010/0155719 A1 * | 6/2010 | Sakata et al. | 257/43 |

* cited by examiner

*Primary Examiner* — Reema Patel
(74) *Attorney, Agent, or Firm* — Innovation Counsel LLP

(57) ABSTRACT

In a method of manufacturing a thin film transistor, a gate electrode is formed on a first surface of a base substrate, a oxide semiconductor layer, insulation layer and photo resist layer are formed an the fast surface of the base substrate having the gate electrode. The insulation layer and the oxide semiconductor layer are patterned using a first photo resist pattern to form an etch-stopper and an active pattern. A source and a drain electrode are formed on the base substrate having the active pattern and the etch-stopper, the source electrode and the drain electrode are overlapped with both ends of the etch-stopper and spaced apart from each other. Therefore, a manufacturing cost may be decreased by omitting a mask when forming the active pattern and the etch-stopper.

14 Claims, 13 Drawing Sheets ly, and have high manufacturing costs. Oxide semi-
METHOD OF MANUFACTURING A THIN-FILM TRANSISTOR, METHOD OF MANUFACTURING A DISPLAY SUBSTRATE, AND DISPLAY SUBSTRATE This application claims priority under 35 U.S.C. §119 to Korean Patent Application No. 10-2012-0023850, filed on Mar. 8, 2012 and all the benefits accruing therefrom under 35 U.S.C. §119, the content of which, in its entirety, is herein incorporated by reference.

BACKGROUND OF THE INVENTION

1. Field of the Invention

The present invention relate to a method of manufacturing a thin film transistor, a method of manufacturing a display substrate and a display substrate. More particularly, the present invention relate to a method of manufacturing a thin film transistor, a method of manufacturing a display substrate and a display substrate by using an oxide semiconductor.

2. Description of the Related Art

Generally, a thin film transistor used to actuate a pixel in a display apparatus includes a gate electrode, a source electrode, a drain electrode and an active pattern. The active pattern forms a channel between the source electrode and the drain electrode. The active pattern includes a semiconductor layer that has an amorphous silicon, a poly silicon or an oxide semiconductor.

When an amorphous silicon layer is used as the semiconductor layer, it has the advantage of forming uniformly. On the other hand, due to low electron mobility of an amorphous silicon layer, about 1~10 cm$^2$/V, the actuating property of the thin film transistor is low. Poly silicon, in contrast, has an electron mobility of that is tens to hundreds cm$^2$/V better than the electron mobility of amorphous silicon. However, due to an essential crystallization process of the silicon when forming a poly silicon layer, poly silicon layers tend to form irregularly, and have high manufacturing costs. Oxide semiconductor layers, on the other hand, due to manufacturing by a low temperature process, easy upsizing and high electron mobility, are received attention from many technology areas.

However, the oxide semiconductor is easily damaged during the process of forming an input electrode and an output electrode of the thin film transistor that contacts the oxide semiconductor, and is very sensitive to the damage. Therefore, a property of the thin film transistor is declined. In such a process, an etch-stopper may be formed to minimize the damage of the oxide semiconductor. However, forming the etch-stopper increases the manufacturing cost.

SUMMARY OF THE INVENTION

A method of manufacturing a thin film transistor is provided that prevents damage of an oxide semiconductor layer and has a simplified a process.

A method of manufacturing a display substrate and thin film transistor having improved electrical properties is also provided.

A method of manufacturing a thin film transistor, includes forming a gate electrode on a first surface of a base substrate; forming an oxide semiconductor layer, an insulation layer and a photo resist layer on the first surface of the base substrate having the gate electrode; irradiating a second surface of the base substrate with light, the light passing through the base substrate and into the photo resist layer to form a first photo resist pattern, the second surface being opposite to the first surface; patterning the insulation layer and the oxide semiconductor layer by using the first photo resist pattern to form an etch-stopper and an active pattern, the etch-stopper being disposed on the gate electrode, the active pattern being disposed between the gate electrode and the etch-stopper; and forming a source electrode and a drain electrode on the base substrate having the active pattern and the etch-stopper, end portions of the source electrode and the drain electrode being overlapped with end portions of the etch-stopper, the source and drain electrodes being spaced apart from each other.

The photo resist layer includes a positive typed photoresist in which an irradiated portion the positive typed photoresist is removed by developing; and the method further includes developing the photo resist layer to form the first photo resist pattern.

The forming the active pattern may further include etching the insulation layer by using the first photo resist pattern as an etching mask to form an insulation pattern on the gate electrode; etching the oxide semiconductor layer by using the first photo resist pattern and the insulation layer as an etching mask to form the active pattern; ashing the first photo resist pattern to form a first residual pattern; and etching the insulation pattern exposed through the first residual pattern to form the etch-stopper exposing a peripheral portion of the active pattern.

One end portion of the etch-stopper is recessed with respect to one end portion of the active pattern in a first edge region and a second edge region, the source electrode and the gate electrode are overlapped with each other in the first edge region, and the drain electrode and the gate electrode are overlapped with each other in the second edge region.

Forming the source electrode and the drain electrode may further include forming a data metal layer on the base substrate having the active pattern and the etch-stopper; forming a second photo resist pattern on the data metal layer, the second photo resist pattern having a first thickness portion, a separation region and a second thickness portion, the first thickness portion being disposed on a region of the substrate corresponding to the source electrode and drain electrode, the separation region being, disposed between the source electrode and drain electrode, the second thickness portion being disposed on a third edge region and a fourth edge region, the third edge region connecting, the first edge region and the second edge region, the fourth edge region facing third edge region, the second thickness portion being, thinner than the first thickness portion; and patterning the data metal layer by using the second photo resist pattern.

The patterning the data metal layer may further include etching the data metal layer using the second photo resist pattern as an etching mask; removing the second thickness portion of the second photo resist pattern to form a second residual pattern; and etching the third edge region, the fourth edge region and the data metal layer of the separation region using the second residual pattern as an etching mask.

In another aspect, a method of manufacturing a display substrate is provided, the method including forming a gate line and a gate electrode on as base substrate, the gate electrode being electrically connected to the gate line; forming an oxide semiconductor layer, an insulation layer and a photo resist layer on a first surface of the base substrate having the gate line and the gate electrode; irradiating a second surface of the base substrate with light, the light passing through the base substrate and into the photo resist layer to form a first photo resist pattern, the second surface being opposite to the first surface; patterning the insulation layer and the oxide semiconductor layer by using the first photo resist pattern to form an etch-stopper and an active pattern, the etch-stopper being, disposed on the gate electrode, the active pattern being disposed under the etch-stopper; forming a data line, a source electrode and a drain electrode on the base substrate having the etch-stopper and the active pattern, the data line being extended in a direction crossing, the gate line, the source electrode being electrically connected to the data line, the drain electrode being spaced apart from the source electrode; and forming a pixel electrode electrically connected to the drain electrode.

Forming the active pattern may further include etching the insulation layer using the first photo resist pattern as an etching mask to form an insulation pattern on the gate electrode; etching the oxide semiconductor layer using the first photo resist pattern and the insulation pattern as an etching mask to thou the active pattern; ashing the lint photo resist pattern to form a first residual pattern; and etching the insulation pattern exposed through the first residual pattern to form the etch-stopper exposing a peripheral portion of the active pattern.

Forming the active pattern may further include forming a first wiring pattern and a second wiring pattern, the first wiring pattern being connected to the etch-stopper and disposed on the gate line, the second wiring pattern being connected to the active pattern and disposed between the gate line and the first wiring pattern.

Forming the active pattern may further include patterning the insulation layer to form an insulation pattern and a third wiring pattern, the insulation pattern being disposed on the active pattern, the third wiring pattern being connected to the insulation pattern and disposed on the second wiring pattern; and removing the insulation pattern and an edge of the third wiring pattern to form the etch-stopper and the first wiring pattern, the etch-stopper exposing an edge of the active pattern, the first wiring pattern exposing an edge of the second wiring pattern.

Forming the drain electrode may further include forming a data metal layer on the base substrate having the active pattern, the etch-stopper, the first wiring pattern and the second wiring pattern; patterning the data metal layer using the second photo resist pattern formed on the data metal layer; and removing, a portion of the first wiring pattern and the second wiring pattern on the gate line using the second photo resist pattern and leaving a remaining portion of the first wiring pattern and the second wiring pattern in a position corresponding to a region in which the gate line crosses the data line.

Removing the first wiring pattern and the second wiring pattern may further include forming a first dummy layer and a second dummy layer, the first dummy layer comprising the oxide semiconductor in the region in which the gate line crosses the data line, the second dummy layer comprising the insulation layer formed on the first dummy layer.

Patterning the data metal layer may further include forming the data line and an electrode pattern, the electrode pattern being connected with the data line; and partially removing the electrode pattern to form the source electrode and the dram electrode.

The second photo resist pattern may include a first thickness portion and a second thickness portion, the first thickness portion being disposed in a region of the base substrate corresponding to the source electrode and the drain electrode, the second thickness portion being disposed on a separation region between the source electrode and the drain electrode, and the second thickness portion being thinner than the first thickness portion, the electrode pattern is formed using the second photo resist pattern as an etch stop layer, the source electrode and the drain electrode are thrilled by etching the electrode pattern using a second residual pattern as an etch stop layer, and the second residual pattern is formed by removing the second thickness portion from the second photo resist pattern.

Removing the first wiring pattern and the second wiring pattern uses the second photo resist pattern, the data line and the electrode pattern as an etch stop layer.

The second photo resist pattern may include a first thickness portion and a second thickness portion, the first thickness portion is disposed in a region on the base substrate corresponding to the source electrode and the drain electrode, the second thickness portion is disposed on the electrode pattern, a third edge region and a fourth edge region, the second thickness portion is thinner than the first thickness portion, the electrode pattern is disposed at a separation region between the source electrode and the drain electrode, the third edge region connects the first edge region and the second edge region, and the fourth edge region faces the third edge region.

The second photo resist pattern may include a first thickness portion and a second thickness portion, the first thickness portion is disposed in to region on the base substrate corresponding to the data line, the second thickness portion is disposed on a peripheral region of the data line in the region in which the data line crosses the gate line, and the second thickness portion is thinner than the first thickness portion.

In another aspect, a display substrate is provided, the display substrate including a gate line; a data line extended in a region crossing the gate line; a thin film transistor connected to the gate line and the data line and including an active pattern and an etch-stopper, the active pattern comprising an oxide semiconductor, the etch-stopper being formed on the active pattern; a dummy pattern including a first dummy layer and a second dummy layer, the first dummy layer being disposed in a region where the gate line crosses the data line and including the oxide semiconductor, the second dummy layer being disposed on the first dummy layer formed from a same layer as the etch-stopper; and a pixel electrode connected to the thin film transistor.

The both ends of the first dummy layer face each other along a direction that the data line extends, and protrude beyond the ends of the second dummy layer.

The display substrate may further include a gate insulating layer covering the gate line and the gate electrode of the thin film transistor connected to the gate line, and wherein a portion of the data line other than the region in which the gate line crosses the data line contacts the gate insulation layer.

According to the method of manufacturing a thin film transistor, the method of manufacturing a display substrate and the display substrate, the active pattern includes the oxide semiconductor, a process of forming the source electrode and the drain electrode uses a back exposure using the active pattern and the gate electrode as a mask to form the etch-stopper protecting the active pattern, so that the thin film transistor including the etch-stopper is manufactured without an additional mask. Therefore, the reliability of the alignment and properties of the thin film transistor may be improved, and manufacturing cost may be decreased.

In particular, the active pattern includes the transparent oxide semiconductor, and the back exposure may used to form the active pattern. Therefore, the reliability of forming the active pattern and the etch-stopper may be improved, and increases in the expose process time may be minimized.

A display substrate manufactured by the methods herein includes a the dummy pattern that remains entirely in the region in which the gate line crosses the data line Thus, a signal distortion may be prevented. Also, because the dummy pattern has no effect on the movement of a pixel electrode, an area of pixel electrode may be maximized, so that an aperture ratio may be maximized.

BRIEF DESCRIPTION OF THE DRAWINGS

The above and other features and advantages will become more apparent by describing in detail exemplary embodiments with reference to the accompanying drawings, in which.

DETAILED DESCRIPTION OF THE INVENTION

Hereinafter, exemplary embodiments will be explained in detail with reference to the accompanying drawings.

Figure 1:
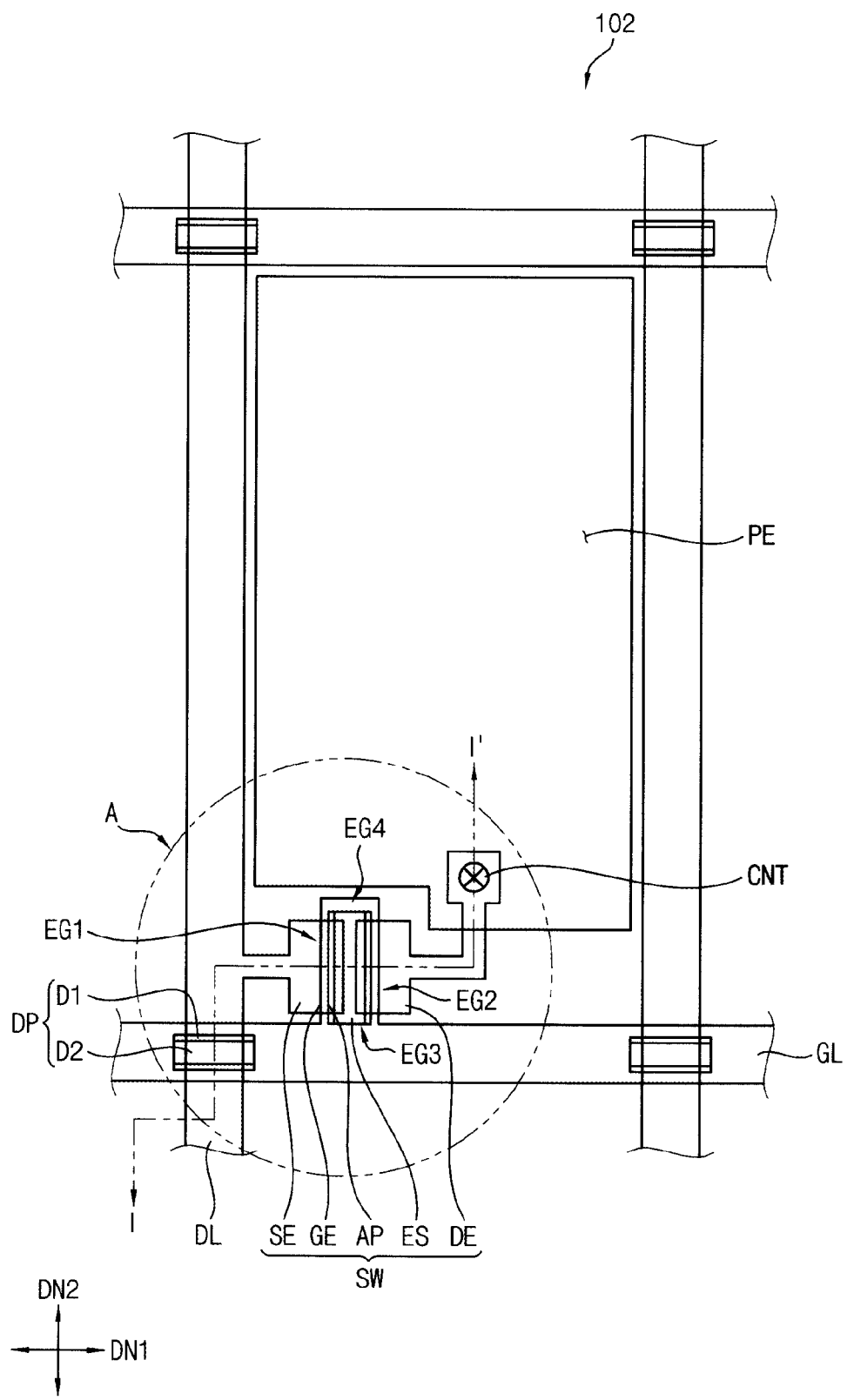
FIG. 1 is a plan view illustrating a display substrate according to an exemplary embodiment.

FIG. 1 is a plan view illustrating a display substrate according to an exemplary embodiment.

Referring to FIG. 1 the display substrate 102 includes a gate line GL, a data line DL, a thin film transistor SW, a dummy pattern DP and a pixel electrode PE. The thin film transistor SW is a switching element of a pixel.

The gate line GL extends a first direction DN1 of the display substrate 102 and the data line DL extends a second direction DN2. The first direction DN1 and the second direction DN2 are crossed each other. The gate line GL and the data line DL are connected to the thin film transistor SW and the pixel electrode PE.

The gate line GE and the data line DL respectively may include a single metal layer or multiple layers having a structure stacked with different metal layers. The gate line GL and the data line DL respectively may include a copper layer. Additionally, a metal layer that is used to improve the adhesive strength or to prevent a contamination of the gate line GL and the data line DL may be formed on a lower and/or a upper surface of the gate line GE and the data line DE. For example, a titanium layer, a copper-manganese alloy layer or yttrium layer may be formed on the lower and/or the upper surfaces of the gate line GL and the data line DL. For another example, an oxide layer may be formed on the lower and/or the upper surfaces of the gate line GL, and the data line DL. The oxide layer may be, for example, indium-zinc oxide IZO, indium-tin oxide ITO, gallium-zinc oxide GZO or zinc-aluminum oxide ZAO. Such a metal layer formed on an upper author a lower surface of the copper layer used in the gate line GE and data line DL may have a thickness that is thinner than the thickness of the copper layer.

Also the gate line GL and the data line DL respectively may include a molybdenum layer. An aluminum layer or a molybdenum alloy layer may be formed on a lower and/or an upper surface of the molybdenum layer.

The thin film transistor SW includes a gate electrode GE, an active pattern AP, an etch-stopper ES, a source electrode SE and a drain electrode DE. The gate electrode GE is a control, electrode of the thin film transistor SW and is connected to the gate line GE. The etch-stopper ES is disposed on the active pattern AP. The source electrode SE is an input electrode of the thin film transistor SW and is connected to the data line GL. The source electrode SE is overlapped with one end of the gate electrode GE, the active pattern AP and the etch-stopper ES. One end of the drain electrode DE faces the source electrode, another end of the drain electrode DE contacts with the pixel electrode PE through the contact hole CNT. The drain electrode DE contacts with the pixel electrode PE, so that the thin film transistor SW may be connected to the pixel electrode PE.

Hereinafter, a region of the display substrate 102 overlapped with the source electrode SE and the gate electrode GE, which is referred to herein as "a first edge region EG1," will be explained. Another region of the display substrate 102 that is opposite the first edge region EG1 in the first direction DN1 and overlapped with the drain electrode DE and the gate electrode GE, which is referred to herein as "a second edge region EG2," will also be explained. The first edge region EG1 and the second edge region EG2 are adjacent to each other and each positioned, respectively, over one end of the gate electrode, the active pattern AP and the etch-stopper SE.

Ends of the gate electrode GE in both the first edge region EG1 and the second edge region EG2 respectively are more protruded relatively than ends of the active pattern AP. Simultaneously, ends of the active pattern AP are more protruded relatively than ends of the etch-stopper ES. Therefore, an area of the active pattern AP on the substrate 102 may be smaller than an area of the gate electrode GE on the substrate 102. An area of the etch-stopper ES may be smaller than an area of the active pattern AP.

The ends of the active pattern AP and the etch-stopper ES are connected to the source electrode SE in the first edge region EG1. Other ends of the active pattern AP and the etch-stopper ES are connected to the drain electrode DE in the second edge region EG2.

A region connecting, the first edge region EG1 and the second edge region EG2 may be defined as a third edge region EG3 and a fourth edge region EG4. The fourth edge region EG4 corresponds to a region connected the gate line GL and the gate electrode GE. The third edge region EG3 faces the fourth edge region EG4. The third edge region EG3 may be a portion of the region on the gate electrode GE that is not overlapped with the source electrode SE or the drain electrode DE. One end of the gate electrode GE is more protruded relatively than ends of the active pattern AP and the etch-stopper ES in the third edge region EG3 and the fourth edge region EG4. One end of the active pattern AP substantially may be positioned to correspond to the position of one end of the etch-stopper ES in the third edge region EG3 and the fourth edge region EG4 respectively.

The active pattern AP includes an oxide semiconductor. The oxide semiconductor has a transition metal oxide form and may include a unary metal oxide or multi metal oxide (in which 'multi' is more than binary metal oxide). For example, the active pattern AP may include an indium gallium zinc oxide IGZO, a indium zinc tin oxide IZTO, etc. The active pattern AP is formed on the oxide semiconductor layer, so that the active pattern AP may be interposed between the source electrode SE and the active pattern AP, simultaneously, may include a buffer layer interposed between the drain electrode DE and the active pattern AP. For example, the buffer layer may include a gallium zinc oxide, GZO.

The etch-stopper ES includes insulation material. For example, the etch-stopper ES may include silicon oxide. Silicon nitride reacts with the active pattern AP, so that the active pattern AP may be deteriorated. Because the etch-stopper ES directly contacts the active pattern AP, the etch-stopper ES preferably includes insulation material having low reactivity with the active pattern AP.

The dummy pattern DP is disposed on a region in which the gate line GL crosses the data line DL. The dummy pattern DP is interposed between the gate line GL and the data line DL in the crossed region. The dummy pattern 10 includes a first dummy layer D1 disposed on the gate line GL and a second dummy layer D2 disposed on the first dummy layer D1. In the dummy pattern DP, both ends of the first dummy layer D1 facing each other in the second direction DN2 are more protruded than both ends of the second dummy layer D2 lacing each other in the second direction DN2. An area of the first dummy layer D1 may be larger than an area of the second dummy layer D2. In the display substrate 102, a plurality of the crossed regions may be disposed on the respective intersections of the gate lines GL and data lines DL.

Figure 2:
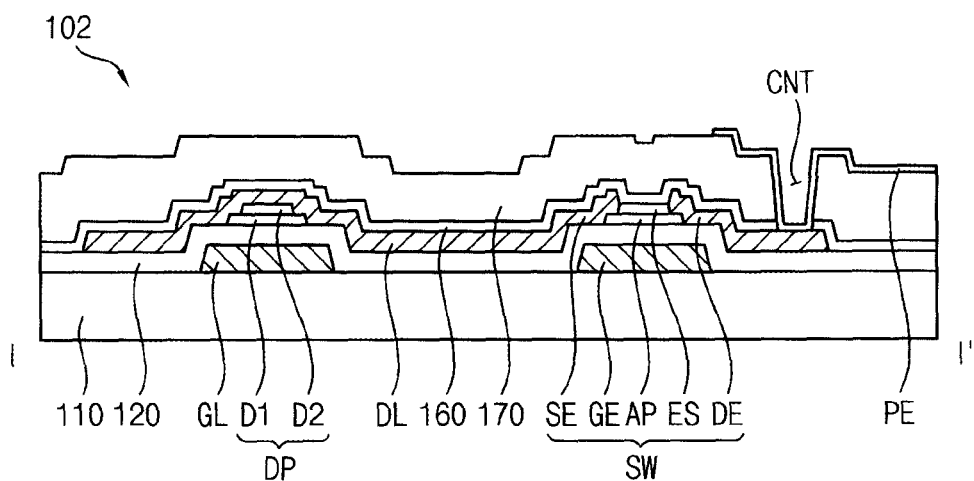
FIG. 2 is a cross-sectional view cutting along a line I-I' of FIG. 1.

FIG. 2 is a cross-sectional view cutting along a line I-I' of FIG. 1.

Referring to FIGS. 1 and 2, the display substrate 102 further includes a gate insulation layer 120 disposed on the base substrate 110, a passivation layer 160 and an organic layer 170.

The gate line GL and the gate electrode GE are formed on the base substrate 110. The gate insulation layer 120 covers the gate electrode GE and the gate line GL and insulates the gate electrode GE and the gate line GL. Also, the gate insulation layer 120 insulates the gate electrode GE and the active pattern AP.

The gate insulation layer 120 may include, for example, silicon oxide. Also, the gate insulation layer 120 may have a multilayered structure including a first layer and a second layer. The first layer is connected to the gate electrode GE, the gate line GL and the base substrate 110 and includes, for example, silicon nitride. The second layer is formed on the first layer, connected to the active pattern AP and includes, for example, silicon oxide. The second layer connected to the active pattern AP includes silicon oxide, so that deterioration of the active pattern AT due to a reaction between the active pattern AP and the silicon nitride of the first layer may be prevented.

The first dummy layer D1 of the dummy pattern DP includes layer that is substantially the same as the active pattern AP. That is, the first dummy layer D1 may include an oxide semiconductor. Also, the second dummy layer D2 includes layer that is substantially the same as the etch-stopper ES. That is, the second dummy layer D2 may include insulation material.

The active pattern AP and the etch-stopper are disposed on the gate electrode GE in the sequence shown in FIG. 2. The dummy pattern DP is interposed between the gate line GL and the data line DL.

The passivation layer 160 covers the data line DL and the source electrode SE, the passivation layer 160 partially covers the drain electrode DE. The organic layer 170 is formed on the passivation layer 160. The organic layer 170 and the passivation layer 160 form the contact hole CNT exposing the drain electrode DE.

The passivation layer 160 may include, for example, silicon nitride and/or silicon oxide. For example, the passivation layer 160 may have a single layer including silicon oxide or a double layer including a first layer and a second layer. The first layer includes silicon oxide. The second layer is firmed on the first layer and includes silicon nitride. The active pattern AP is mostly covered by the etch-stopper ES, the source electrode SE and the drain electrode DE. The dummy layer D1 of the dummy pattern DP is covered, by the data line DL. However, due to a portion partially contacted with the passivation layer 160 same as the active pattern AP corresponding to a region adjacent to a vertex formed by the first edge region and the fourth edge region EG1 and EG4, the active pattern may include the silicon oxide.

The pixel electrode PE is formed on the organic layer 170, so that the pixel electrode PE contacts the drain electrode through the contact hole CNT formed by the organic layer 170 and the passivation layer 160.

Hereinafter, the method of manufacturing the display substrate 102 including the thin film transistor SW of FIGS. 1 and 2 will be explained in detail with reference to FIGS. 3A, 3B, 4, 5A, 5B, 6A, 6B to 11A and 11B.

Figure 3A:
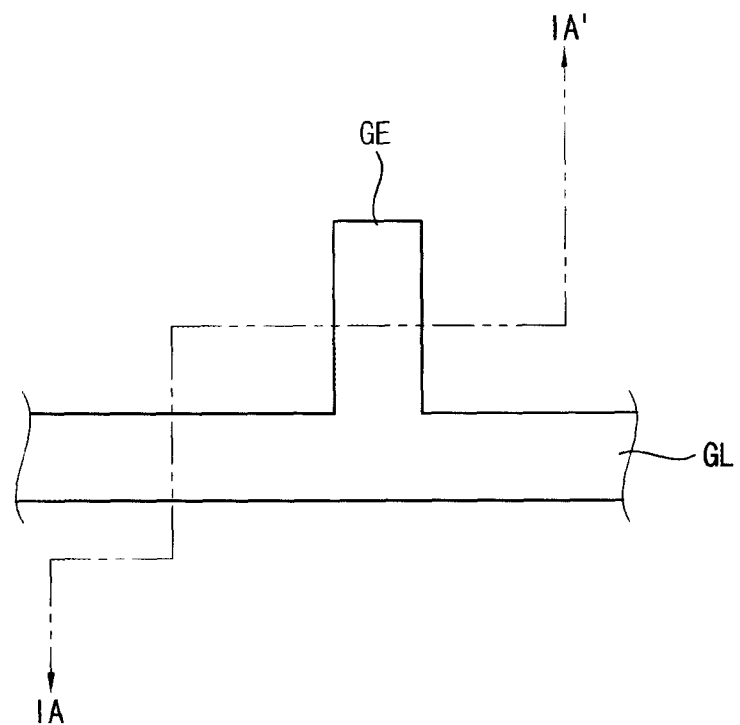
FIG. 3A is a plan view illustrating a form in P, process of a gate pattern of FIG. 2.
Figure 3B:
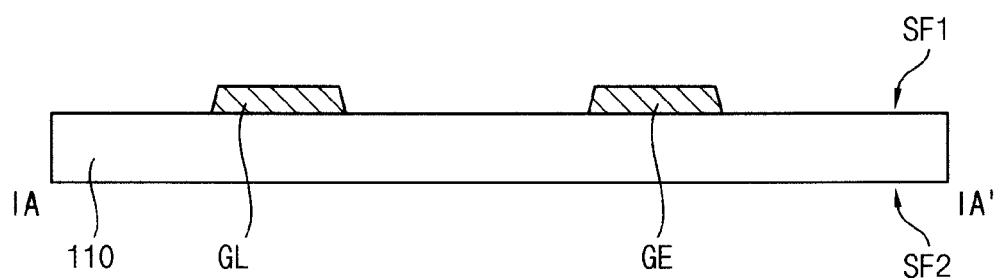
FIG. 3B is a cross-sectional view cutting along a line IA-IA' of FIG. 3A.

FIG. 3A is a plan view illustrating a forming process of a gate pattern of FIG. 2, and FIG. 3B is a cross-sectional view cutting along a line IA-IA' of FIG. 3A.

Referring to FIGS. 3A and 3B, a gate metal layer is formed on the base substrate 110 and the gate metal layer is patterned to form a gate pattern, which includes the gate line GL and the gate electrode GE. The gate metal layer is formed on the first surface SF1 of base substrate 110. The gate pattern is formed by using photo-lithography on the gate metal layer.

The base substrate 110 is transparent substrate. A light provided from a second surface SF2 passes the first surface SF1. The second surface SF2 is opposite to the first surface SF1. All or a portion of the light provided from a second surface SF2 may pass through the base substrate 110. For example, the base substrate 110 may be a glass substrate or plastic substrate.

The gate metal layer is an opaque layer. A light provided from a second surface SF2 is blocked by the gate metal layer. When the quantity of light provided from a second surface SF2 is about 100%, the quantity of light passing a region having the gate pattern may be about 0%.

Figure 4:
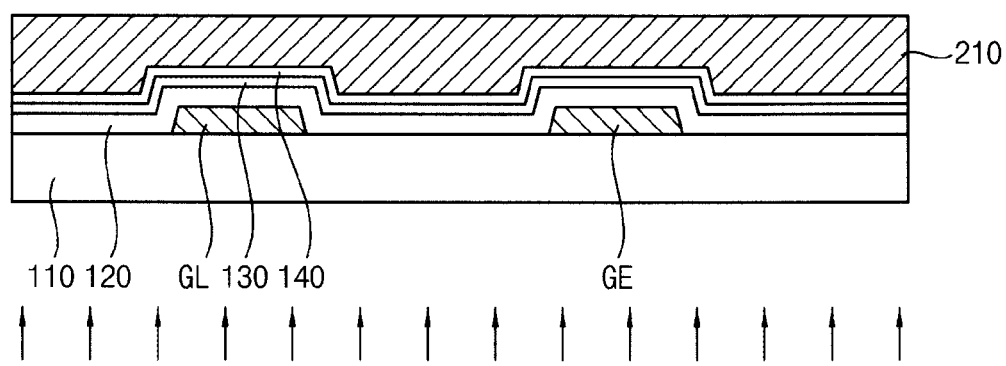
FIG. 4 is a cross-sectional view illustrating an expose process for forming an active pattern, an etch-stopper and a dummy pattern of FIG. 2.

FIG. 4 is a cross-sectional view illustrating an exposure process for forming an active pattern, an etch-stopper and a dummy pattern of FIG. 2.

Referring to FIG. 4, the gate insulation layer 120, an oxide semiconductor layer 130, an insulation layer 140 and a first photo resist layer 210 are formed in sequence on the base substrate 110 having the gate pattern. The oxide semiconductor layer 130, the insulation layer 140 and the first photo resist layer 210 are formed on the first surface SF1. The first surface SF1 is a front surface of the base substrate 110.

A back exposure to the second surface SF2 is performed. The second surface SF2 is a rear surface of the base substrate 110. The second surface SF2 is irradiated with light, and the light either passes from the second surface SF2 to the first photo resist layer 210 through the second surface SF2 or is blocked by the gate pattern. That is, the first photo resist layer 210 of a region having the gate pattern is exposed to light, and the first photo resist layer 210 of a region not having the gate pattern is not exposed to the light.

For the back exposure process, the first, photo resist layer 210 forms a positive photo resist composition. The positive photo resist composition is removed by dissolving a region irradiated with the light. The positive photo resist composition has a property that the region that light was blocked from entering is not dissolved and thus remains. For example, the positive photo resist composition may include a polymer, photosensitive compound, etc. When light is provided to the positive photo resist composition, the photosensitive compound is activated, so that the polymer is changed in condition and may be dissolved in an alkali developer. Because of the condition of the polymer in the region of that did not received light, the polymer is not dissolved in an alkali developer. After this, in a development process using the alkali developer, the polymer of an irradiated region is removed by dissolution in an alkali developer, so that the polymer of the region of which light was blocked from remains on the base substrate 110.

Figure 5A:
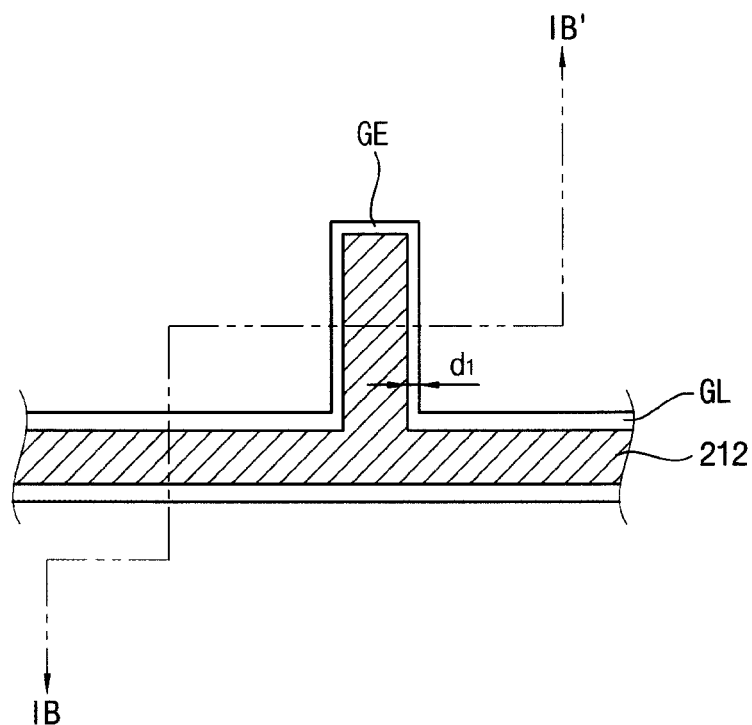
FIGS. 5A, 6A and 7A are plan views illustrating an etching process for forming an active pattern, an etch-stopper and a dummy pattern of FIG. 2.
Figure 5B:
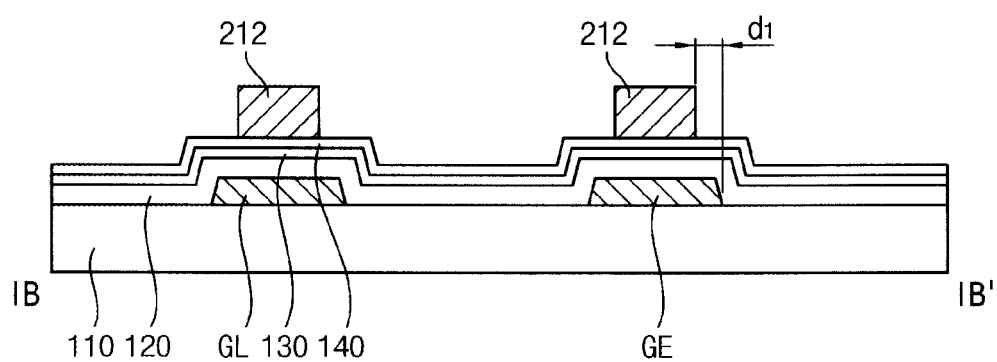
FIGS. 5B, 6B and 7B are cross-sectional views cutting along a line IB-IB' of FIG. 5, a line IC-IC' of FIG. 6 and a line ID-ID' of FIG. 7.
Figure 6A:
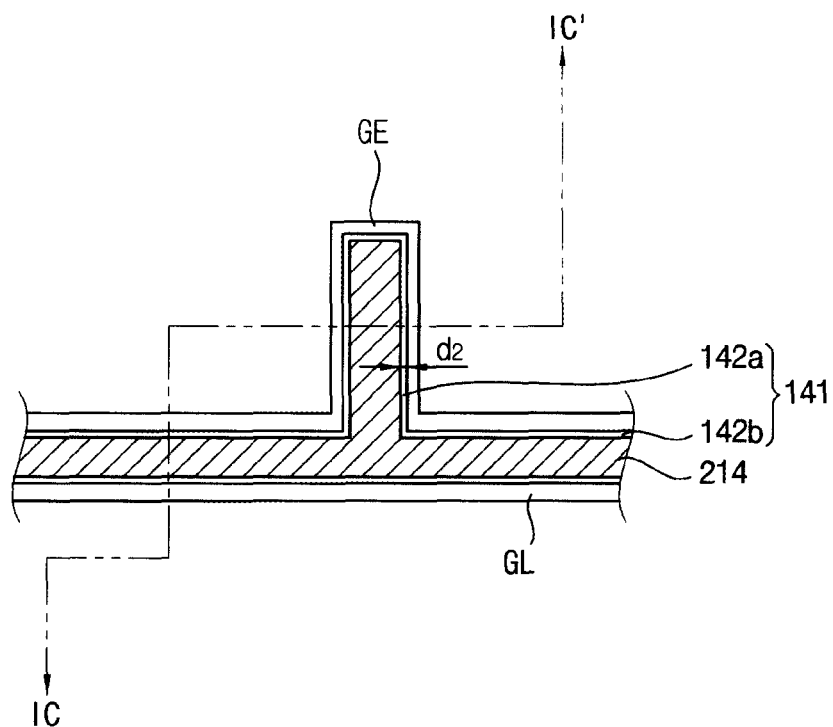
Figure 6B:
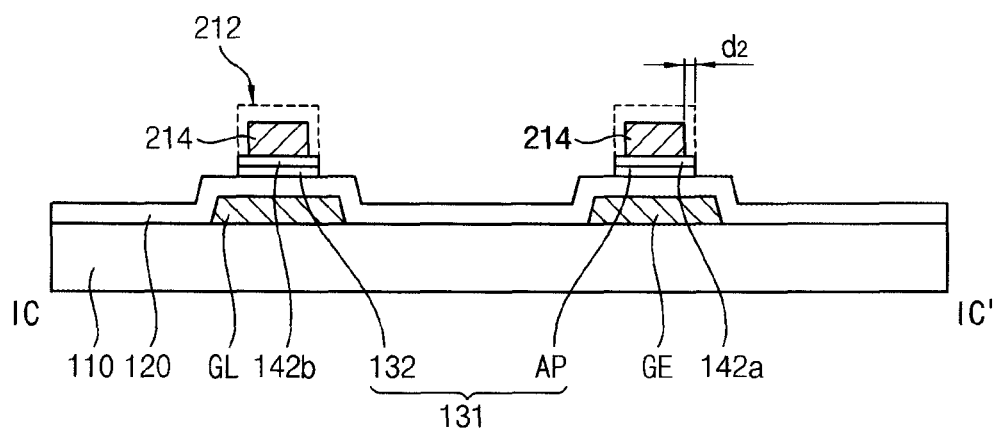
Figure 7A:
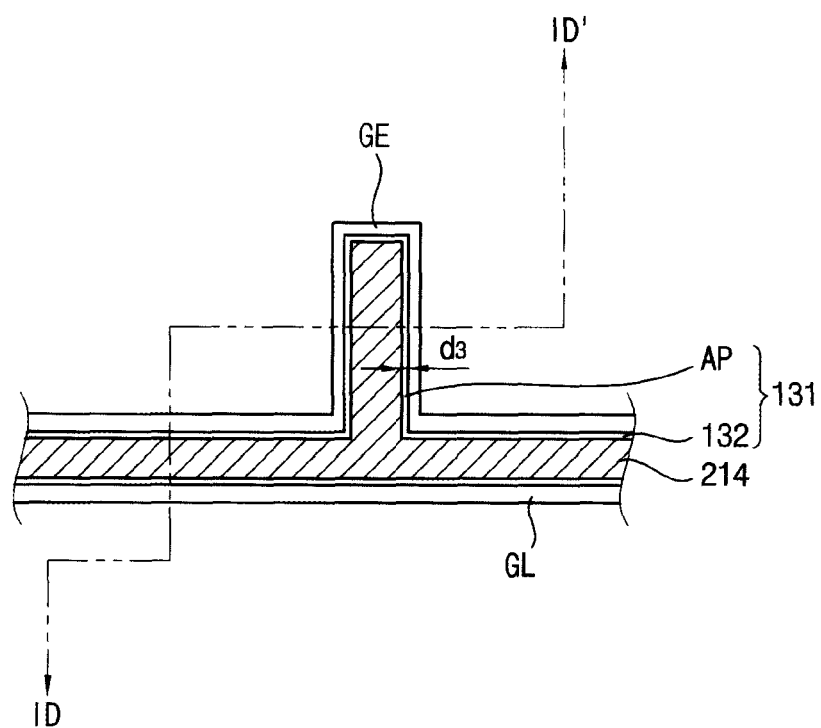
Figure 7B:
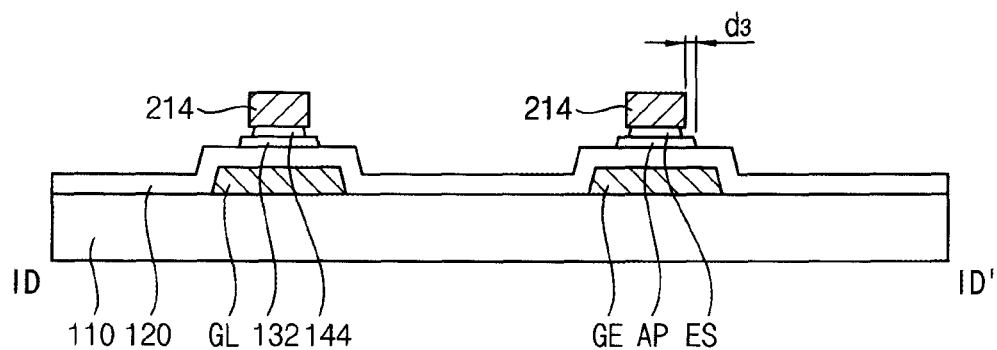

FIGS. 5A, 6A and 7A are plan views illustrating an etching process for forming an active pattern, an etch-stopper and a dummy pattern as shown in FIG. 2. FIGS. 5B, 6B and 7B are cross-sectional views cutting along a line of FIG. 5, a line IC-IC' of FIG. 6 and a line ID-ID' of FIG. 7.

Referring to FIGS. 5A and 5B, the first photo resist layer 210 is developed, so that a first photo resist pattern 212 is formed. The first, photo resist pattern 212 is disposed on a region having the gate pattern (e.g. the insulation layer on the gate line GL and the gate electrode GE). When the first photo resist layer 210 is irradiated with light, due to diffraction and/or dispersion in an edge of the gate pattern, a region of the photoresist layer 210 that is substantially blocked from receiving light is smaller in area than a region having the gate pattern. Therefore, in a plane view, an area of the first photo resist pattern 212 may be less than an area of the gate pattern. In a cross-sectional structure, an edge of the first photo resist pattern 212 may be recessed relatively with respect to an edge of the gate pattern. The first distance d1 created by such recession is related to a first electric capacity $C_{gs}$ between the gate electrode GE and the source electrode SE and a second electric capacity $C_{gd}$ between the gate electrode GE and the drain electrode DE. When the first distance d1 is increased, due to a decreasing of the first electric capacity and the second electric capacity $C_{gs}$ and $C_{gd}$, unnecessary parasitic electric capacity may be decreased. The first photo resist layer 210 forms the first photo resist pattern 212 by using the positive photo resist composition and back exposure, so that the first distance d1 may be more than 0 μm. Although the area is different, the plane shape of the first photo resist pattern 212 and a plane shape of the gate pattern may be similar figures.

In a region other than a region having pattern, the base substrate 110, the gate insulation layer 120, the oxide semiconductor layer 130 and the insulation layer 140 have a stacked structure in regular sequence. Due to three transparent layers formed on the base substrate 110, a light irradiated from the second surface SF2 may reach the first photo resist layer 210 through the insulation layer 140.

The insulation layer 140 and the oxide semiconductor layer 130 are patterned by using the first photo resist pattern 212 as a etch stop layer.

Referring to FIGS. 6A and 6B, the insulation layer 140 is patterned by using the first photo resist pattern 212, so that a first pattern 141 is formed. A second pattern 131 is formed by patterning the oxide semiconductor layer 130.

The first pattern 141 includes an insulation pattern 142a disposed on the gate electrode GE. The first pattern 141 may include a first wiring pattern 14b disposed on the gate line GL and the first wiring pattern 142b may be connected to the insulation pattern 142a. An edge of the first pattern 141 may be substantially same as an edge of the first photo resist pattern 212.

The second pattern 131 includes an active pattern disposed on the gate electrode GE. The second pattern 131 is disposed below the insulation pattern 142a among the first pattern 141. The second pattern 131 may include a second wiring pattern 132 which is connected to the active pattern AP and disposed on the gate line GL. The second wiring pattern 132 is disposed below the first wiring, pattern 142b among the first pattern 141. An edge of the second pattern 131 may be positioned in substantially the same position as an edge of the first pattern 141. Although an under-cut is formed, the under under-cut is at the edge of the second pattern 131, which is more depressed than the edge of the fast pattern 141. Such an under under-cut may be minimized by controlling the etching of the oxide semiconductor layer 130.

Therefore, when viewed in a planar view, because the second pattern 131 is disposed underneath the first pattern 141, the second pattern 131 may be not observed.

After the first pattern and the second pattern 141 and 131 are formed, a first residual pattern 214 is formed by ashing a portion of the first photo resist pattern 212. The first residual pattern 214 is formed by removing a designated thickness of the first photo resist pattern 212. An edge of the first pattern 141 may be exposed by the first residual pattern 214. For example, an edge of the first residual pattern 214 may be spaced a second distance d2 from an edge of the first pattern 141. When the second distance d2 is increased, the active pattern AP contacts the source electrode SE and the drain electrode DE on a wider region. The second distance d2 may be maximized by considering a separation distance between the source electrode SE and the drain electrode DE.

Referring to FIGS. 7A and 7B, a portion of the first pattern 141 is etched by using the first residual pattern 214 as an etch stop layer. An edge of the insulation pattern 142a is partially etched, so that the etch-stopper ES is formed. The etch-stopper ES is disposed on the active pattern AP. An edge of the etch-stopper ES is more recessed than an edge of the active pattern AP.

Simultaneously, an edge of the first wiring pattern 142b is partially etched, so that a third wiring pattern 144 is formed. The third wiring pattern 144 is connected to the etch-stopper ES. The third wiring pattern 144 is disposed on the second wiring pattern 132. An edge of the third wiring pattern 144 is more recessed than an edge of the second wiring pattern 132.

In the etching of the first pattern 141, the first pattern 141 is over-etched by a predetermined distance which is determined, by taking into account the separation distance between the source electrode and the drain electrode, so that the edges of the first pattern 141 are more recessed than edges of the first residual pattern 214. An edge of the first residual pattern 214 and the etch-stopper ES and an edge of the first residual pattern 214 and an edge of the third wiring pattern 144 may be spaced apart by a third distance d3. When viewed in a planar view, before the removal of the first residual pattern 214, the etch-stopper ES and the third wiring pattern 144 are not observed due to the first residual pattern 214.

Figure 8A:
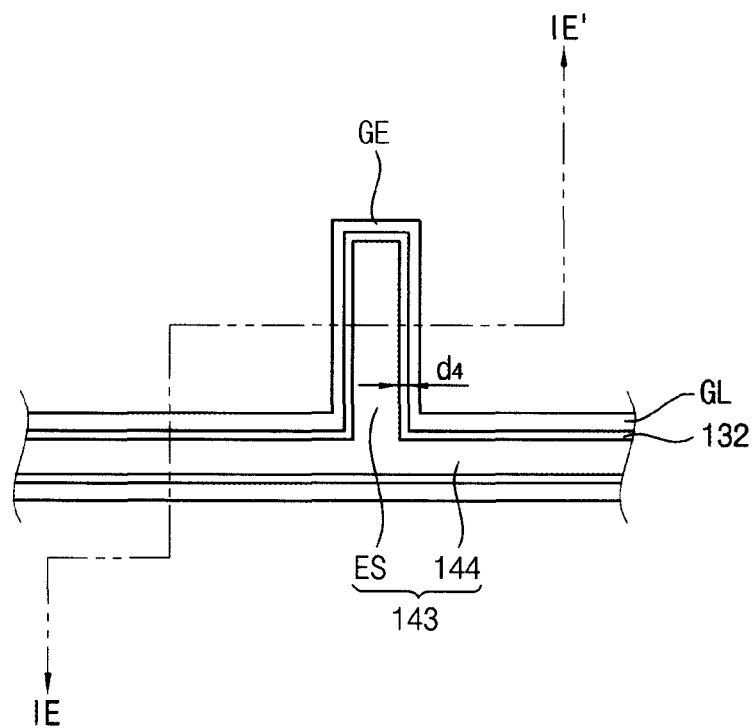
FIG. 8A is a plan view illustrating a stripping process for forming an active pattern, an etch-stopper and a dummy pattern of FIG. 2.
Figure 8B:
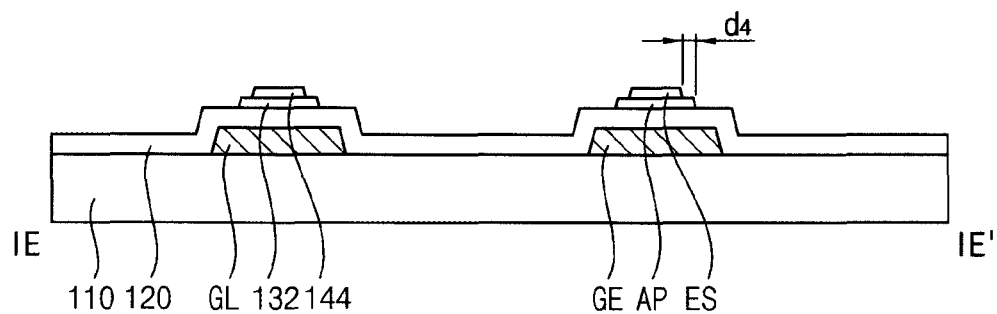
FIG. 8B is a cross-sectional view cutting along a line IE-IE' of FIG. 8A.

FIG. 8A is a plan view illustrating a stripping process for forming an active pattern, an etch-stopper and a dummy pattern as illustrated in FIG. 2, FIG. 8B is a cross-sectional view cutting along a line IE-IE' of FIG. 8A.

Referring to FIGS. 8A and 8B, the first residual pattern 214 is stripped. When viewed in a planar view, the active pattern AP and the etch-stopper ES are disposed on the gate electrode GE, so that the disposing structure may be observed. Also, the second wiring pattern 132 and the third wiring pattern 144 are disposed on the gate line (IL, so that the disposing structure may be observed. A third pattern 143 is disposed on the second pattern 131. The third pattern 143 includes the etch-stopper ES and the third wiring pattern 144.

A distance between an edge of the active pattern AP and an edge of the etch-stopper ES may be a fourth distance d4. Due to the over-etching of the insulation pattern 142a, the fourth distance d4 may be longer than the third distance d3. When the fourth distance d4 is larger, the extent of contact between the active pattern AP and the source electrode SE and between the active pattern AP and the drain electrode DE is increased. Therefore, the thin film transistor SW of stable structure may be formed.

As described above, the back exposure uses the gate electrode GE as a mask, the active pattern AP and the etch-stopper ES are formed by the back exposure, so that the active pattern AP and/or the etch-stopper ES may be formed without using additional masks. Thus, a cost of additional mask is not necessary, and the manufacturing cost of the display substrate 102 including the thin film transistor SW may be reduced. Thus, a productivity of the display substrate 102 and the thin film transistor SW may be improved. Also, because the active pattern AP and the etch-stopper ES are formed by using the gate electrode GE as a mask, the reliability of the alignment of the gate electrode GE, the active pattern AP and the etch-stopper ES may be improved. Therefore, a property of the thin film transistor SW may be improved.

Also, because the active pattern AP includes a transparent oxide semiconductor, the back exposure may be performed sufficiently within the range of a light quantity and a light irradiation time in an entire exposure using the separate mask. Therefore, the reliability in forming the active pattern AP and the etch-stopper ES may be improved, and a increasing of an exposing process time may be minimized.

Figure 9A:
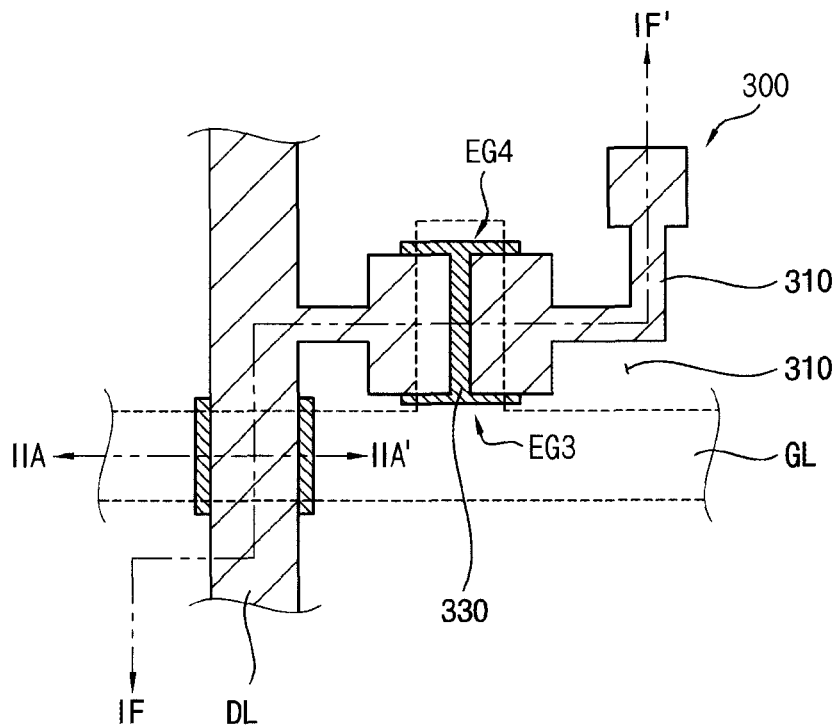
FIG. 9A is a plan view illustrating a substrate having a mask using for forming a source pattern of FIG. 2.
Figure 9B:
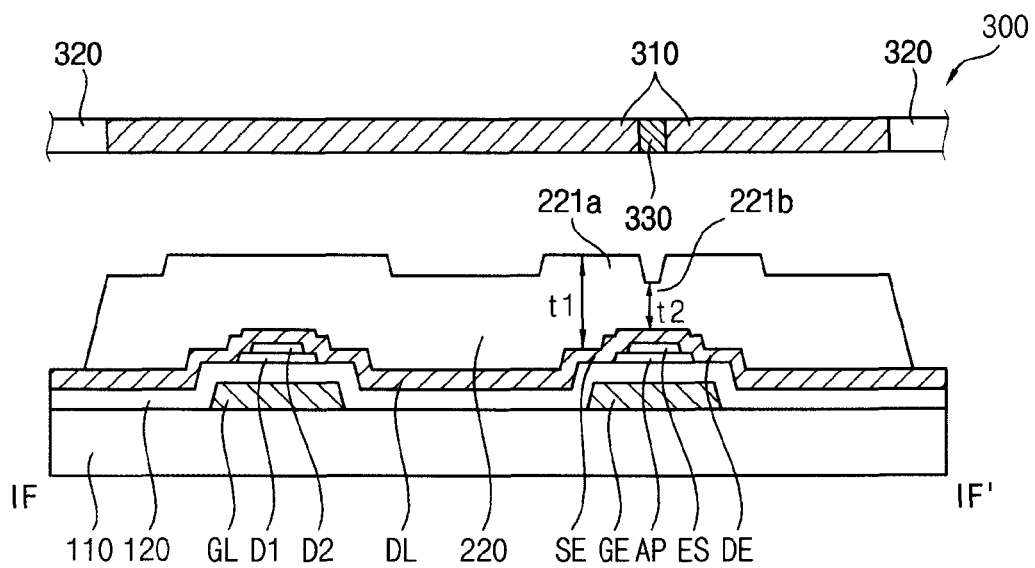
FIG. 9B is a cross-sectional view cutting along a line IF-IF' of FIG. 9A.
Figure 9C:
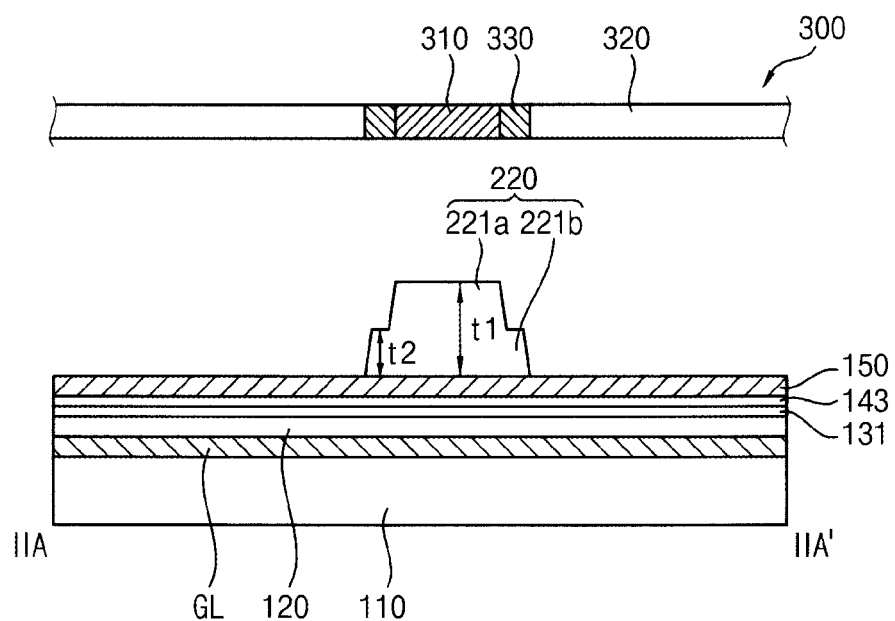
FIG. 9C is a cross-sectional view cutting along a line IIA-IIA' of FIG. 9A.

FIG. 9A is a plan view illustrating a substrate having a mask using for forming a source pattern as illustrated in FIG. 2, FIG. 9B is a cross-sectional view cutting along a line IF-IF' of FIG. 9A. FIG. 9C is a cross-sectional view cutting along a line IIA-IIA' of FIG. 9A.

Referring to FIGS. 9A, 9B and 9C, the second pattern 131 and the third pattern 143 are formed in regular sequence on the gate insulation layer 120 the gate insulation layer 120 is disposed on the base substrate 110 (as described above), the data metal layer 150 (FIG. 9C) is formed on the base substrate 110, and a second photo resist layer is formed on the data metal layer 150. A mask 300 is disposed on the base substrate 110 having the second photo resist layer, the upper side of the mask 300 is irradiated with light, which passes through the mask 300 to the second photo resist layer. A development is then performed, so that a second photo resist pattern 220 is formed.

The mask 300 includes a first region 310, a second region 320 and a third region 330. The first region 310 is disposed over the region corresponding to the data line DL shown in FIGS. 1 and 2, the source electrode SE and the drain electrode DE. The third region 330 is disposed over the separation region between the source electrode SE and the drain electrode DE, the third edge region and the fourth edge region. The third region 330 is also disposed over the gate line GL adjacent to a region in which the data line DL crosses the gate line GL. The second region 320 is disposed over all region of the base substrate 110 other than where the first region 310 and the third region 330 are disposed.

When the second photo resist layer is formed with a positive photo resist composition, the first region 310 may be a shaded part, the second region 320 may be a penetration part, and the third region 330 may be a diffraction part. The quantity of light passing through the first region 310 is less than the quantity of light passing through the second region 320 and the third region 330. For example, when the amount of light that passes through the second region 320 is 100%, the amount of light passing through the first region 310 may be 0%. The amount of light that passes through the third region is greater than the amount that passes through the first region, but less than the amount that passes through the second region.

When the second photo resist layer is formed instead with a negative photo resist composition, the tint region 310 may be a penetration part and the second region 320 may be a shaded part. A product of patterning the second photo resist layer having a negative photo resist composition may be same as a shape of the second photo resist pattern 220.

The second photo resist pattern 220 includes a first thickness portion 221a and a second thickness portion 221b. The first thickness portion 221a has a first thickness t1 and is thrilled on the base substrate 110 in a region corresponding to the first region 310. The second thickness portion 221b has a second thickness t2 and is formed on the base substrate 110 in a region corresponding to the third region 330. The second thickness portion 221b is thinner than the first thickness portion 221a.

An under-cut between the active pattern AP and the etch-stopper ES is prevented by the gate electrode GE of the third and the fourth edge regions EG3 and EG4 and the second thickness portion 221b disposed on the gate line GL adjacent to the cross region. Simultaneously, an under-cut between the first dummy layer D1 and the second dummy layer D2 is prevented.

Figure 10A:
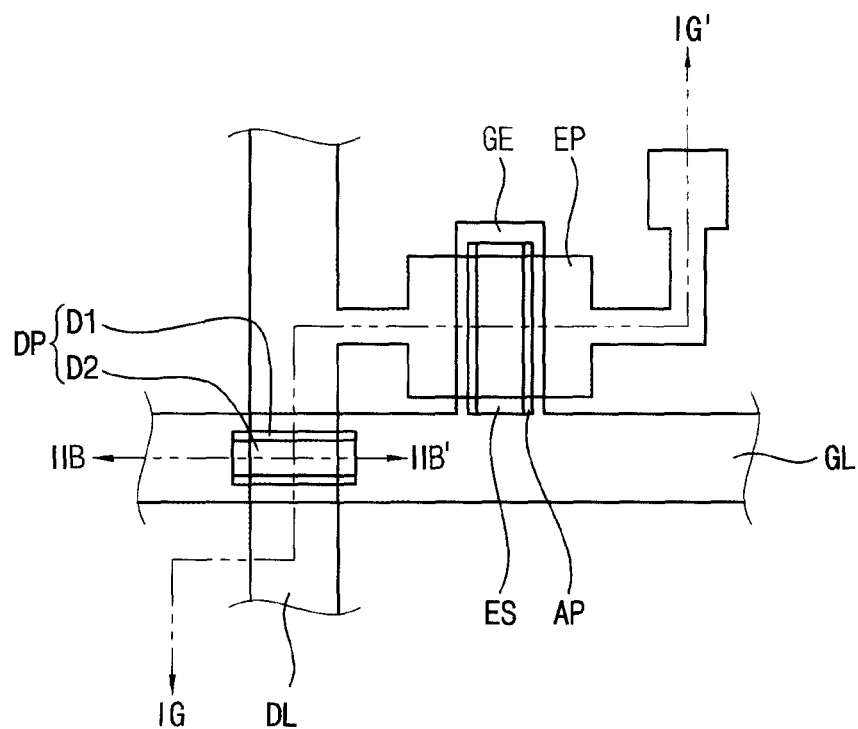
FIG. 10A is a plan view illustrating a process for forming to source pattern on an active pattern, an etch-stopper and a dummy pattern of FIG. 2.
Figure 10B:
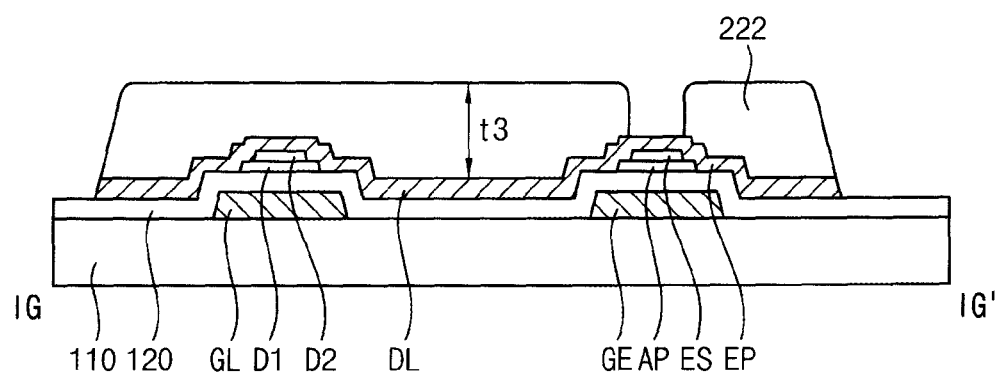
FIG. 10B is a cross-sectional view cutting along a line IG-IG' of FIG. 10A.
Figure 10C:
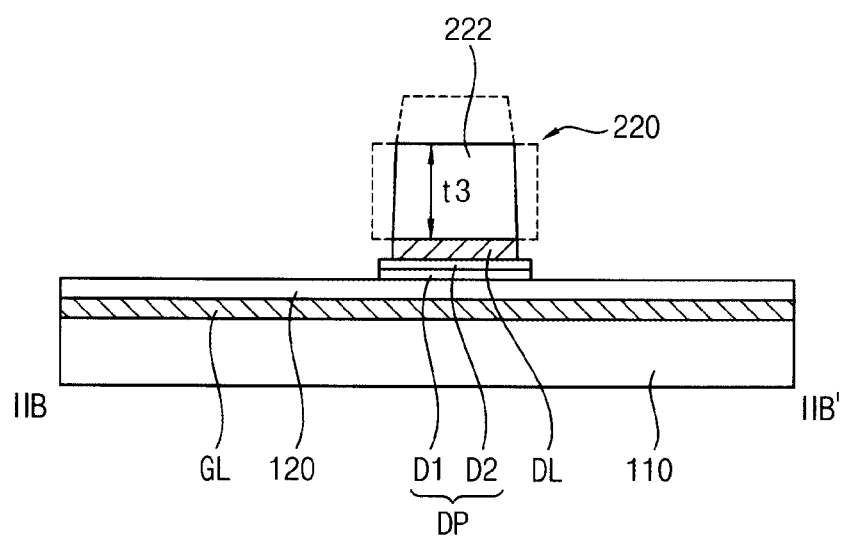
FIG. 10C is a cross-sectional view cutting along a line IIB-IIB' of FIG. 10A.

FIG. 10A is a plan view illustrating a process for forming a source pattern on an active pattern, an etch-stopper and a dummy pattern as illustrated in FIG. 2. FIG. 10B is a cross-sectional view cutting along a line IG-IG' of FIG. 10A. FIG. 10C is a cross-sectional view cutting along a line IIB-IIB' of FIG. 10A.

Referring to FIGS. 10A, 10B and 10C, a first-etching of the data metal layer 150 is performed by using the second photo resist pattern 220, so that the data line DL and an electrode pattern EP is formed. The electrode pattern EP is connected to the data line DL and disposed on the substrate 110 in areas corresponded to the positions in which the source electrode SE, the drain electrode DE and the separation region of the source electrode SE and the drain electrode DE are to be located.

The third pattern 143 and the second pattern 131 are etched by using the second photo resist pattern 220, the data line DE and electrode pattern EP as a etch stop layer. From the third pattern 143, the third wiring pattern 144 with the exception of the region in which the gate line GL crosses the data line DL is removed. Therefore, the second dummy layer D2 and the etch-stopper ES are all that remains on the base substrate 110. Simultaneously, from the second pattern 131, the second wiring pattern 132 with the exception of the cross region is removed. Therefore, the first dummy layer D1 and the active pattern are all that remains on the base substrate 110, so that the dummy pattern DP including the first and the second dummy layers is formed.

The gate electrode GE of the third and the fourth edge regions EG3 and EG4 and the second and the third patterns 132 and 133 disposed on the gate line GL adjacent to the cross region remain as a portion of the active pattern and the etch-stopper by the second thickness 221b.

The second residual pattern 222 is formed by ashing the second photo resist pattern 220. In the second residual pattern 222, the second thickness portion 221b is removed from the second photo resist pattern 220. The second residual pattern 222 may have a thud thickness t3 that is less than the first thickness t1. A portion of the electrode pattern EP is exposed through the second residual pattern 222. Also, a portion of the dummy pattern DP of the cross region is exposed through the second residual pattern 222.

A portion of the electrode pattern EP and the data line DL is partially removed by using the second residual pattern 222 as an etch stop layer, so that the source electrode SE and the drain electrode DE are formed. In the process of etching the electrode pattern EP, damage of the active pattern AP is prevented by the etch-stopper ES. Therefore, the thin film transistor shown in FIGS. 1 and 2 is manufactured.

Also, the data line DL formed by the first etching is partially etched by using the second residual pattern 222 as a mask, so that forming under-cut between the dummy pattern DP and the data line DL is prevented.

The second residual pattern 222 is removed, so that the gate line GL, the data line DL, the thin film transistor SW and the dummy pattern DP remain.

According to the example method described above, a display substrate manufactured by reducing the number of mask used in manufacturing process is formed in lower of a signal wiring. However, according to the present disclosure, because the dummy pattern DP remains only in a region in which the gate line GL crosses the data line DL, a distortion of a signal by the dummy pattern DP may be prevented.

Figure 11A:
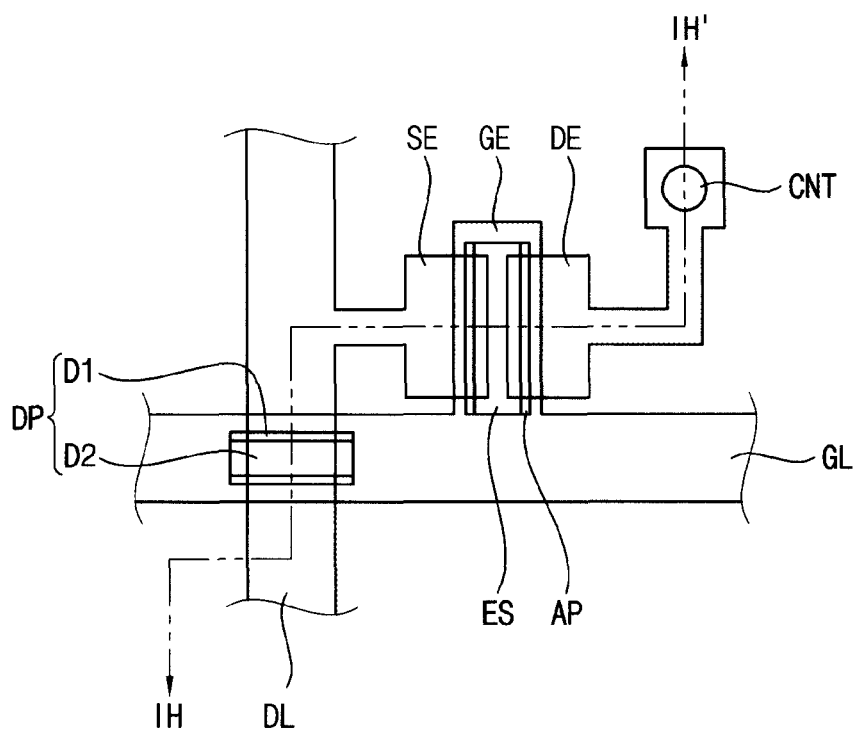
FIG. 11A is a plan view illustrating a process for forming a contact hole of FIG. 2.
Figure 11B:
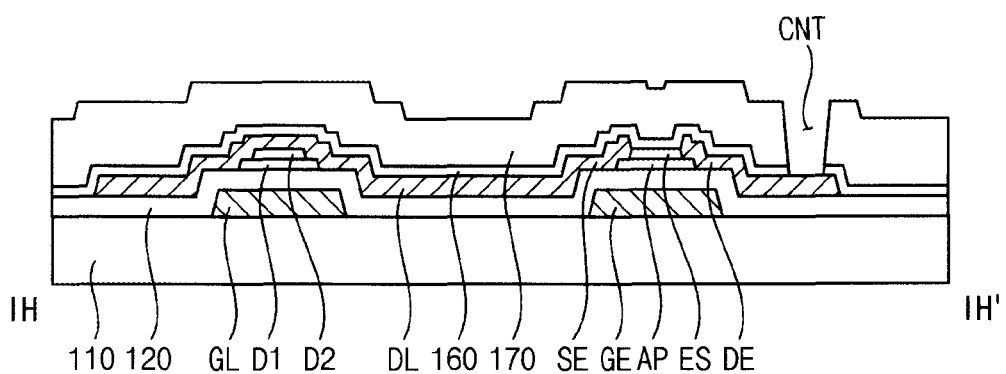
FIG. 11B is a cross-sectional view cutting along a line IH-IH' of FIG. 11A.

FIG. 11A is a plan view illustrating a process for forming a contact hole as illustrated in FIG. 2. FIG. 11B is a cross-sectional view cutting along a line IH-IH' of FIG. 11A.

Referring to FIGS. 11A and 11B, the gate line GL, the data line DL, the thin film transistor SW and the dummy pattern are formed on the base substrate 110. And the passivation layer 160 and the organic layer 170 are formed in sequence.

A third photo resist pattern (not shown) exposing a region corresponding to the contact hole CNT is formed on the organic layer 170, so that the contact hole CNT is formed by etching the organic layer 170 and the passivation layer 160.

Also, when the organic layer 170 is formed with photosensitive material, a first hole corresponding to the contact hole CNT is formed by exposing the organic layer 170, and then the contact hole CNT is formed by forming a second hole on the passivation layer 160 by using the organic layer 170 as a etch stop layer.

The organic layer 170 may be omitted. And a hole formed on the passivation layer 160 may be defined as the contact hole CNT.

A transparent electrode layer is formed on the base substrate 110 having the contact hole CNT, a fourth photo resist pattern not shown) is formed on the transparent electrode layer, and then the pixel electrode PE shown in FIGS. 1 and 2 may be formed by patterning using the fourth photo resist pattern as an etch stop layer. Because the dummy pattern DP remains on the base substrate 110 in a minimum area, a movement of the pixel electrode PE is substantially not affected. Therefore, an area of the pixel electrode PE may be minimized, and an aperture ratio may be maximized.

Although not shown in drawings, when a storage line is additionally formed in the process of forming the gate line GL and the gate electrode GE, the first and the second patterns 131 and 141 are disposed on the storage line. The third pattern 143 described in FIGS. 8A and 8B is formed by partial etching of the second patterns 141 disposed on the storage line, and then the third pattern 143 disposed on the storage line may be removed in the process of removing the second and the third wiring pattern 132 and 144 described in FIGS. 9A and 9B. Therefore, finally a pattern including the oxide semiconductor 130 and the insulation layer 140 does not remain on the storage line. However, when the storage line is overlapped with the data line DL a pattern substantially the same as the dummy pattern shown in FIGS. 1 and 2 may be formed.

As described above, the active pattern AP and the etch-stopper ES is formed by back exposure using the gate electrode GE as a mask, so that a productivity of the thin film transistor SW and the display substrate 110 may be improved. Also, the thin film transistor SW having stable structure including the active pattern AP and the etch-stopper ES is manufactured, so that the properties of the thin film transistor SW may be improved.

Hereinafter, a display substrate 104 will be explained in detail with reference to FIG. 12.

Figure 12:
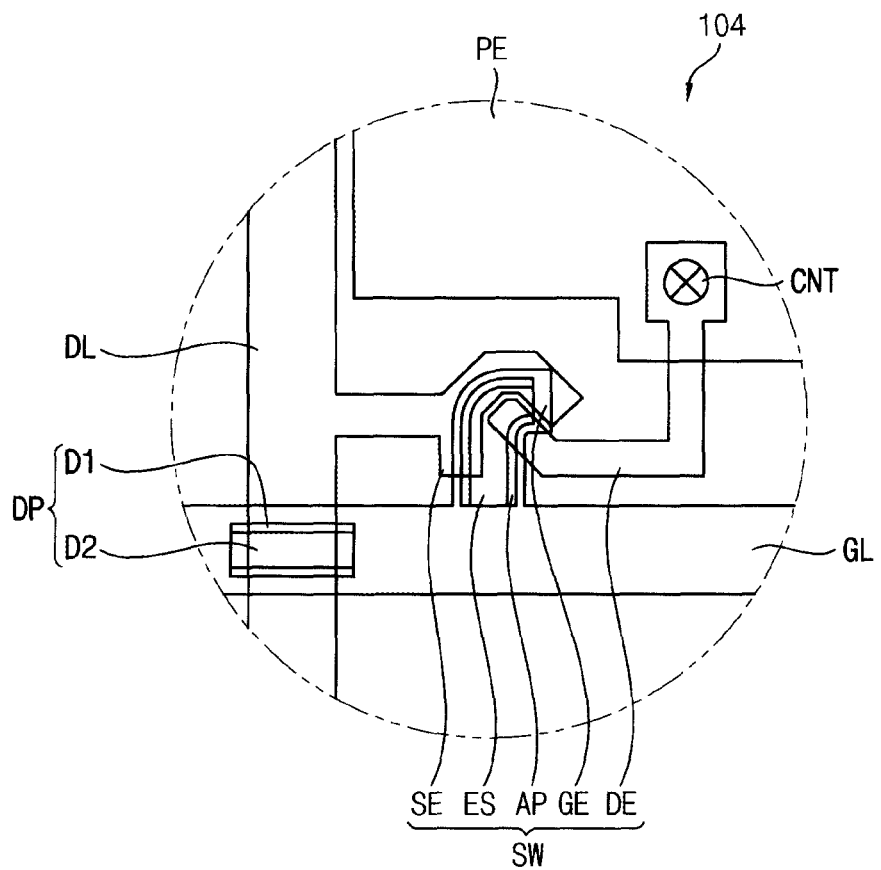
FIG. 12 is a partially extended plan view illustrating, a display substrate according to another exemplary embodiment.

FIG. 12 is a partially extended plan view illustrating a display substrate according to another exemplary embodiment.

A display substrate 104 shown in FIG. 12 is substantially same as the display substrate 102 shown in FIGS. 1 and 2 with the exception of a plane structure of the thin film transistor SW. Therefore, a cross-sectional structure is explained with reference to FIG. 2 and repetitive description is omitted.

Referring to FIG. 12, the display substrate 104 includes a gate line GL a data line DL, a thin film transistor SW, a dummy pattern DP and a pixel electrode PE.

The thin film transistor SW includes a gate electrode GE, an active pattern AP, an etch-stopper ES, a source electrode SE and a drain electrode DE. The gate electrode GE is connected to the gate line GL. The source electrode SE is connected to the data line DL. The gate electrode GE, the active pattern AP and the etch-stopper ES may have a planar structure with a J-shape. Therefore, separation region of the source electrode SE and the drain electrode DE is a channel part, and a shape of the channel part may be to J-shape. According to a structure of the thin film transistor SW shown in FIG. 12, because a channel length of the thin film transistor SW shown in FIG. 12 may be more than that of the thin film transistor SW shown in FIG. 1, while a channel width of the thin film transistor SW shown in FIG. 12 may be less than that of the thin film transistor SW shown in FIG. 1, an extent of the etch-stopper ES may be minimized in the thin film transistor SW shown in FIG. 12. Therefore, a first electric capacity $C_{gs}$ between the gate electrode GE and the source electrode SE and a second electric capacity $C_{gd}$ between the gate electrode GE and the drain electrode DE may be decreased.

A display substrate 104 shown in FIG. 12 is manufactured by a method substantially same as a manufacturing method of the display substrate 102 shown in FIGS. 1 and 2. Therefore, repetitive description is omitted.

Although not shown in drawings, different, from the channel part having the J-shape shown in FIG. 12, the thin film transistor may alternatively have a plane structure with a U-shape. When the channel part has a U-shape, an input electrode may have a U-shape connected to a data line and an output electrode may have an I-shape spaced apart from the input electrode having the U-shape. The channel part with the U-shape may be more advantageous than the channel part of J-shape because it increases the channel length. The active pattern AP and the etch-stopper ES may also have a U-shape. A display substrate having a channel part with a U-shape is manufactured by a method substantially same as a manufacturing method of the display substrate 102 shown in FIGS. 1 and 2.

In above exemplary embodiments, the thin film transistor applied as a switching element of the pixel included in a display region of a display panel is described, however, the thin film transistor may be applied to a driving part connected to the pixel and directly formed on the display substrate, for example transistor included in a gate driving part. Also, the thin film transistor may be applied to the switching element of an electroluminescent display including a switching element and driving element. And the thin film transistor may be applied to the driving element respectively.

As described above, an active pattern includes oxide semiconductor, in a process of forming a source electrode and a drain electrode, an etch-stopper protecting the active pattern is formed by a back exposure process using the active pattern and the gate electrode as a mask, so that a thin film transistor including the etch-stopper is manufactured without using an additional mask. Therefore, the reliability of the alignment of the gate electrode, the active pattern and the etch-stopper may be improved, the properties of the thin film transistor may be improved and manufacturing costs may be reduced. Particularly, because the active pattern includes the transparent oxide semiconductor, the back exposure may be efficiently performed within the range of a light quantity and a light irradiation tune in an entire exposure using the separate mask. Therefore, the reliability of forming the active pattern and the etch-stopper may be improved, and the exposing, time may not be greatly increased. Also, the exposing time may be decreased.

When a display substrate manufactured to reduce the number of the masks is used, a dummy pattern is formed under the display substrate along a gate line and a data line, however, according to the present disclosure, because the dummy pattern remains entirely in the region in which the gate line crosses the data line, a signal distortion may be prevented. Also, because the dummy pattern has no effect on the movement of the pixel electrode, an area of the pixel electrode may be maximized, so that an aperture ratio may be maximized.

Although a few exemplary embodiments have been described, those skilled in the art will readily appreciate that many modifications are possible in the example embodiments without materially departing from the novel teachings and advantages of the disclosure.

What is claimed is:

1. A method of manufacturing a thin film transistor, the method comprising:
    forming a gate electrode and a gate line on a first surface of a base substrate;
    forming an oxide semiconductor layer, an insulation layer and a photo resist layer on the first surface of the base substrate having the gate electrode and the gate line, in sequence;
    irradiating a second surface of the base substrate with light, the light passing through the base substrate and into the photo resist layer to form a first photo resist pattern, the second surface being opposite to the first surface;
    patterning the insulation layer and the oxide semiconductor layer by using the first photo resist pattern to form an insulation pattern and an oxide semiconductor pattern, the insulation pattern being disposed on the gate electrode and the gate line, the oxide semiconductor pattern being disposed between the gate electrode and the insulation pattern and between the gate line and the insulation pattern;
    forming a data metal layer on the base substrate having the active pattern and the insulation pattern;
    forming a second photo resist pattern on the data metal layer,
    firstly patterning the data metal layer to form a data line crossing the gate line and to partially expose the insulation pattern;
    patterning the insulation pattern and the oxide semiconductor pattern to form an active pattern overlapping with the gate electrode, an etch stopper on the active pattern and a dummy pattern only where the gate line overlaps with the data line;
    secondly patterning the data metal layer to form a source electrode and a drain electrode, end portions of the source electrode and the drain electrode being overlapped with end portions of the etch-stopper, the source and drain electrodes being spaced apart from each other.

2. The method of claim 1, wherein
the photo resist layer includes a positive typed photoresist in which an irradiated portion of the positive typed photoresist is removed by developing; and the method further comprises:
    developing the photo resist layer to form the first photo resist pattern.

3. The method of claim 1, wherein the forming the insulation pattern and the oxide semiconductor pattern further comprises:
    firstly etching the insulation layer by using the first photo resist pattern as an etching mask;
    etching the oxide semiconductor layer by using the first photo resist pattern to form the oxide semiconductor pattern;
    ashing the first photo resist pattern to form a first residual pattern; and
    secondly etching the insulation layer by using the first residual pattern as an etching mask to form the insulation pattern exposing a peripheral portion of the active pattern.

4. The method of claim 3, wherein one end portion of the etch-stopper is recessed with respect to one end portion of the active pattern in a first edge region and a second edge region, the source electrode and the gate electrode are overlapped with each other in the first edge region, and the drain electrode and the gate electrode are overlapped with each other in the second edge region.

5. A method of manufacturing a display substrate, the method comprising:
    forming a gate line and a gate electrode on a base substrate, the gate electrode being electrically connected to the gate line;
    forming an oxide semiconductor layer, an insulation layer and a photo resist layer on a first surface of the base substrate having the gate line and the gate electrode;
    irradiating a second surface of the base substrate with light, the light passing through the base substrate and into the photo resist layer to form a first photo resist pattern, the second surface being opposite to the first surface;

patterning the insulation layer and the oxide semiconductor layer by using the first photo resist pattern to form an etch-stopper and an active pattern, the etch-stopper being disposed on the gate electrode, the active pattern being disposed under the etch-stopper;

forming a data line, a source electrode and a drain electrode on the base substrate having the etch-stopper and the active pattern, the data line being extended in a direction crossing the gate line, the source electrode being electrically connected to the data line, the drain electrode being spaced apart from the source electrode;

forming a first dummy layer and a second dummy layer, the first dummy layer comprising the oxide semiconductor only in the region in which the gate line crosses the data line, the second dummy layer comprising the insulation layer formed on the first dummy layer; and forming a pixel electrode electrically connected to the drain electrode.

6. The method of claim 5, wherein forming the active pattern further comprises:

etching the insulation layer using the first photo resist pattern as an etching mask to form an insulation pattern on the gate electrode;

etching the oxide semiconductor layer using the first photo resist pattern and the insulation pattern as an etching mask to form the active pattern;

ashing the first photo resist pattern to form a first residual pattern; and etching the insulation pattern exposed through the first residual pattern to form the etch-stopper exposing a peripheral portion of the active pattern.

7. The method of claim 5, wherein the forming the active pattern further comprises forming a first wiring pattern and a second wiring pattern, the first wiring pattern being connected to the etch-stopper and disposed on the gate line, the second wiring pattern being connected to the active pattern and disposed between the gate line and the first wiring pattern.

8. The method of claim 7, wherein the forming the active pattern further comprises:

patterning the insulation layer to form an insulation pattern and a third wiring pattern, the insulation pattern being disposed on the active pattern, the third wiring pattern being connected to the insulation pattern and disposed on the second wiring pattern; and removing the insulation pattern and an edge of the third wiring pattern to form the etch-stopper and the first wiring pattern, the etch-stopper exposing an edge of the active pattern, the first wiring pattern exposing an edge of the second wiring pattern.

9. The method of claim 7, wherein the forming the drain electrode further comprises:

forming a data metal layer on the base substrate having the active pattern, the etch-stopper, the first wiring pattern and the second wiring pattern;

patterning the data metal layer using the second photo resist pattern formed on the data metal layer; and removing a portion of the first wiring pattern and the second wiring pattern on the gate line using the second photo resist pattern and leaving a remaining portion of the first wiring pattern and the second wiring pattern in a position corresponding to a region in which the gate line crosses the data line.

10. The method of claim 9, wherein the patterning the data metal layer further comprises:

forming the data line and an electrode pattern, the electrode pattern being connected with the data line; and partially removing the electrode pattern to form the source electrode and the drain electrode.

11. The method of claim 10, wherein the second photo resist pattern comprises a first thickness portion and a second thickness portion, the first thickness portion being disposed in a region of the base substrate corresponding to the source electrode and the drain electrode, the second thickness portion being disposed on a separation region between the source electrode and the drain electrode, and the second thickness portion being thinner than the first thickness portion, the electrode pattern is formed using the second photo resist pattern as an etch stop layer, the source electrode and the drain electrode are formed by etching the electrode pattern using a second residual pattern as an etch stop layer, and the second residual pattern is formed by removing the second thickness portion from the second photo resist pattern.

12. The method of claim 9, wherein the removing the first wiring pattern and the second wiring pattern uses the second photo resist pattern, the data line and the electrode pattern as an etch stop layer.

13. The method of claim 9, wherein the second photo resist pattern comprises a first thickness portion and a second thickness portion, the first thickness portion is disposed in a region on the base substrate corresponding to the source electrode and the drain electrode, the second thickness portion is disposed on the electrode pattern, a third edge region and a fourth edge region, the second thickness portion is thinner than the first thickness portion, the electrode pattern is disposed at a separation region between the source electrode and the drain electrode, the third edge region connects the first edge region and the second edge region, and the fourth edge region faces the third edge region.

14. The method of claim 9, wherein the second photo resist pattern comprises a first thickness portion and a second thickness portion, the first thickness portion is disposed in a region on the base substrate corresponding to the data line, the second thickness portion is disposed on a peripheral region of the data line in the region in which the data line crosses the gate line, and the second thickness portion is thinner than the first thickness portion.

* * * * *